US012666739B2

(12) United States Patent
Luo

(10) Patent No.: US 12,666,739 B2
(45) Date of Patent: Jun. 23, 2026

(54) PIXEL STRUCTURE AND IMAGE SENSOR

(71) Applicant: VIVO MOBILE COMMUNICATION CO., LTD., Dongguan (CN)

(72) Inventor: Yi Luo, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 362 days.

(21) Appl. No.: 18/379,247

(22) Filed: Oct. 12, 2023

(65) Prior Publication Data

US 2024/0038806 A1     Feb. 1, 2024

Related U.S. Application Data

(63) Continuation of application No. PCT/CN2022/085795, filed on Apr. 8, 2022.

(30) Foreign Application Priority Data

Apr. 12, 2021   (CN) .......................... 202110391981.7

(51) Int. Cl.
   *H10F 39/00*       (2025.01)
   *H10F 39/18*       (2025.01)
(52) U.S. Cl.
   CPC ....... *H10F 39/8063* (2025.01); *H10F 39/182* (2025.01); *H10F 39/8053* (2025.01); *H10F 39/807* (2025.01)
(58) Field of Classification Search
   CPC .............. H10F 39/8063; H10F 39/182; H10F 39/8053; H10F 39/802; H10F 39/8023;

H10F 39/18; H10F 39/803; H10F 39/807; H04N 25/62; H04N 25/11; G09G 2320/0209; G09G 5/363
See application file for complete search history.

(56) References Cited

U.S. PATENT DOCUMENTS

| | | | | |
|---|---|---|---|---|
| 2017/0170216 A1* | 6/2017 | Lee | ..................... | H10F 39/8063 |
| 2018/0309944 A1* | 10/2018 | Lee | ........................ | H04N 25/62 |
| 2021/0193720 A1* | 6/2021 | Seo | ........................ | H10F 39/805 |

FOREIGN PATENT DOCUMENTS

| | | |
|---|---|---|
| CN | 1591882 A | 3/2005 |
| CN | 101159281 A | 4/2008 |
| CN | 102420235 A | 4/2012 |

(Continued)

OTHER PUBLICATIONS

International Search Report issued in corresponding International Application No. PCT/CN2022/085795, mailed Jun. 14, 2022, 4 pages.

(Continued)

*Primary Examiner* — Sonya McCall-Shepard
(74) *Attorney, Agent, or Firm* — IPX PLLC

(57) ABSTRACT

A pixel structure and an image sensor are provided. The pixel structure includes: a plurality of pixel units adjacent to each other and are arranged in an array. A first optical partition wall is arranged between the adjacent pixel units. The pixel structure further includes a microlens assembly. The microlens assembly is located on an upper side of all the pixel units and is opposite to all the pixel units. Each of the pixel units includes a color filter, a pixel microlens, and a photoelectric conversion layer arranged successively from top to bottom. Colors of color filters of the adjacent pixel units are different.

19 Claims, 4 Drawing Sheets

(56)         References Cited

FOREIGN PATENT DOCUMENTS

| | | | |
|----|------------|---|---------|
| CN | 105493285  | A | 4/2016  |
| CN | 108900750  | A | 11/2018 |
| CN | 109922270  | A | 6/2019  |
| CN | 110349987  | A | 10/2019 |
| CN | 110896083  | A | 3/2020  |
| CN | 111586323  | A | 8/2020  |
| CN | 113178457  | A | 7/2021  |
| JP | 2008108918 | A | 5/2008  |

OTHER PUBLICATIONS

First Office Action issued in related Chinese Application No. 202110391981.7, mailed May 12, 2022, 9 pages.

* cited by examiner

PIXEL STRUCTURE AND IMAGE SENSOR

CROSS-REFERENCE TO RELATED APPLICATIONS

This application is a continuation of International Application No PCT/CN2022/085795, filed on Apr. 8, 2022, which claims priority to Chinese Patent Application No 202110391981.7, filed on Apr. 12, 2021. The entire contents of each of the above-referenced applications are expressly incorporated herein by reference.

TECHNICAL FIELD

This application pertains to the field of image technologies, and specifically relates to a pixel structure and an image sensor.

BACKGROUND

The image sensor can use the photoelectric conversion function of photoelectric devices to convert a light image on a photosensitive surface into an electrical signal proportional to the light image to realize photoelectric conversion, and can complete functions such as photographing of electronic devices such as mobile phones or tablet computers. The Complementary Metal-Oxide-Semiconductor (CMOS) image sensor has the characteristics of high integration, low power consumption, high speed, and low cost, so that the CMOS image sensor can be widely used.

However, the CMOS image sensor may distort the image seriously when the electronic device outputs a high-resolution image, which affects the image quality.

SUMMARY

This application aims to provide a pixel structure and an image sensor.

This application is implemented as follows.

According to a first aspect, an embodiment of this application proposes a pixel structure, including:

a plurality of pixel units which are adjacent to each other and are arranged in an array, where a first optical partition wall is arranged between the adjacent pixel units; and a microlens assembly, where the microlens assembly is located on an upper side of all the pixel units and is opposite to all the pixel units, where each of the pixel units includes a color filter, a pixel microlens, and a photoelectric conversion layer arranged successively from top to bottom, and colors of color filters of the adjacent pixel units are different.

According to a second aspect, an embodiment of this application proposes an image sensor, including the pixel structure as described above.

In the embodiments of this application, colors of the color filters of the adjacent pixel units are different, so that technical compromise that is made by using the pixel rearrangement technology can be avoided, and image distortion can be prevented. In addition, the first optical partition wall is arranged between the adjacent pixel units, so that crosstalk noise between pixels can be reduced, and the pixel microlens is arranged under the color filter, which can help the pixel unit to better concentrate light, and improve the optical performance. Therefore, in this application, better image quality can be obtained when the image sensor outputs a high-resolution image.

Additional aspects and advantages of the present disclosure will be set forth in part in the following description, and will become apparent in part from the following description, or may be learned from practice of the present disclosure.

BRIEF DESCRIPTION OF DRAWINGS

The foregoing and/or additional aspects and advantages of the present disclosure will become apparent and readily understandable from the descriptions of the embodiments with reference to the following accompanying drawings.

DETAILED DESCRIPTION

Figure 1:
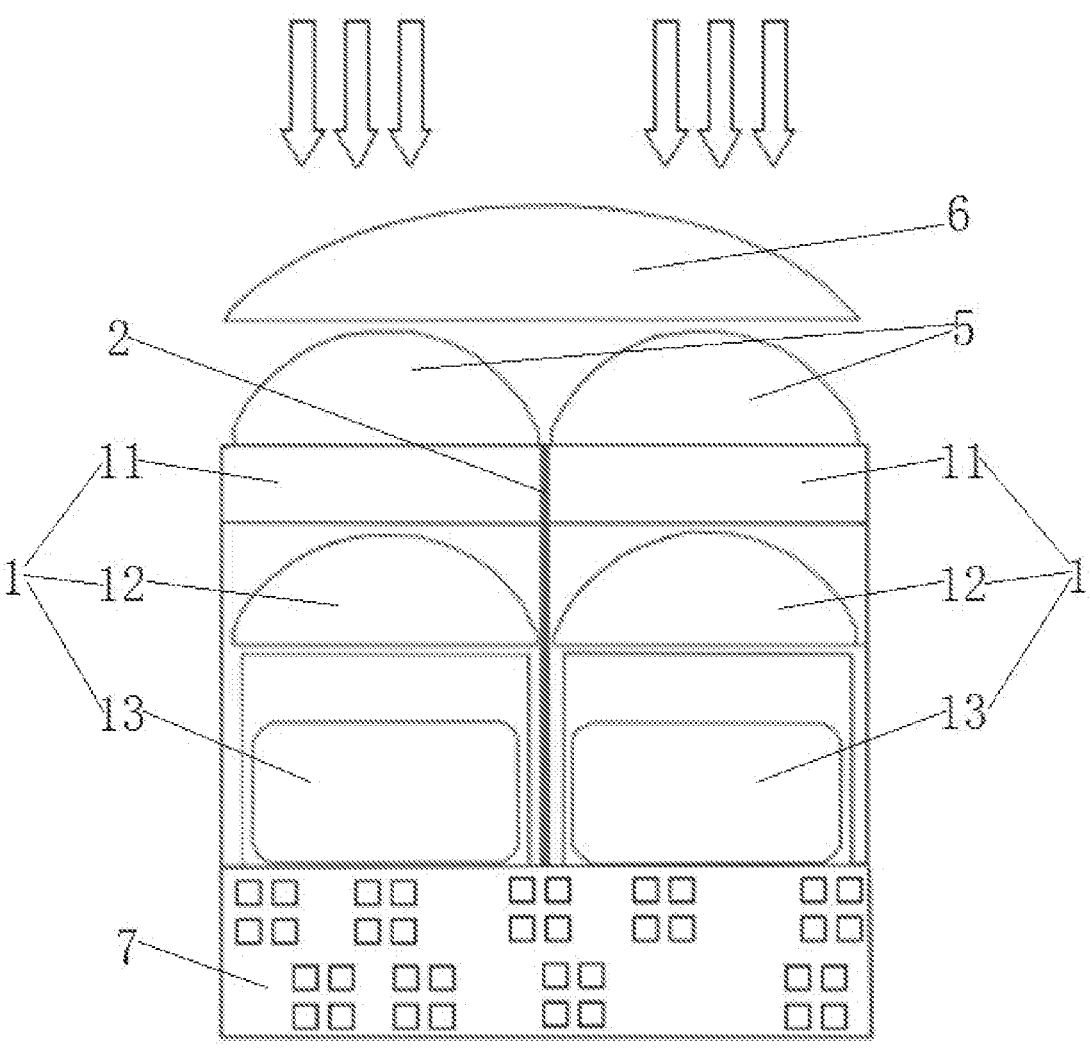
FIG. 1 is a schematic diagram of a structure of a pixel unit according to a first embodiment of the present disclosure.

The following describes in detail the embodiments of the present disclosure. Examples of the embodiments are illustrated in the accompanying drawings. Reference numerals which are the same or similar throughout the accompanying drawings represent identical or similar elements or elements having identical or similar functions. The embodiments described below with reference to the accompanying drawings are exemplary, and are only intended to explain the present disclosure and should not be understood as a limitation of the present disclosure. All other embodiments obtained by a person of ordinary skill in the art based on the embodiments of this application without creative efforts shall fall within the protection scope of this application.

Features of terms "first" and "second" in the specification and claims of this application may explicitly or implicitly include one or more such features. In the description of the present disclosure, unless otherwise specified, "a plurality of" means at least two. In addition, in the specification and the claims, "and/or" represents at least one of connected objects, and a character "/" generally represents an "or" relationship between associated objects.

In the description of the present disclosure, it should be understood that terms "center", "longitudinal", "lateral", "length", "width", "thickness", "up", "down", "front", "back", "left", "right", "vertical", "horizontal", "top", "bottom", "inner", "outer", "clockwise", "counterclockwise", "axial", "radial", "circumferential", and the like indicate orientations or position relationships based on the orientations or position relationships shown in the drawings, and are only for ease of describing the present disclosure and simplifying the description, rather than indicating or implying that the apparatus or element must have a specific orientation, be configured and operated in a specific orientation, and therefore cannot be understood as a limitation of the present disclosure.

In the description of the present disclosure, it should be noted that, unless expressly specified and defined otherwise, terms such as "mounted", "connected to each other", and "connected to" should be understood in a broad sense. For example, "connection" may be a fixed connection, a detachable connection, or an integral connection; or may be a mechanical connection or an electrical connection, or may be a direct connection, an indirect connection through an intermediate medium, or a connection between two elements. A person of ordinary skill in the art may understand specific meanings of the above terms in the present disclosure based on a specific situation.

A pixel structure according to embodiments of this application is described below with reference to FIG. 1 to FIG. 4.

As shown in FIG. 1, the pixel structure according to some embodiments of the present disclosure includes a plurality of pixel units 1 which are adjacent to each other and are arranged in an array and a microlens assembly. The pixel units 1 can be a pixel structure corresponding to a single pixel, each pixel unit 1 has a clear assigned color value, and a first optical partition wall 2 is arranged between the adjacent pixel units 1. The first optical partition wall 2 can be a structure formed by using Deep Trench Isolation (DTI), which can prevent crosstalk noise between the adjacent pixel units 1, help the single pixel unit 1 to better concentrate light, improve optical performance of the single pixel unit 1, and improve imaging quality without any off-chip lens/film.

The microlens assembly is located on an upper side of all the pixel units 1, and the microlens assembly is opposite to all the pixel units 1, which can assist the pixel unit 1 in better concentrating light, improve the optical performance of the pixel unit 1, and improve the image quality. The microlens assembly can be in a single-layer structure or in a multi-layer stacked structure. When the microlens assembly is in the multi-layer stacked structure, a plurality of layers of microlenses can be in a overlapped structure. For example, sizes and shapes of the plurality of layers of microlenses are the same, and the plurality of layers of microlenses are stacked in a one-to-one correspondence, and projections of edges of the plurality of layers of microlenses are overlapped in a vertical direction; and the plurality of layers of microlenses can also be in an incompletely overlapped structure, for example, the sizes or shapes of the plurality of layers of microlenses are not exactly the same, and when the plurality of layers of microlenses are stacked, the projections of the edges of the plurality of layers of microlenses are not exactly the same in a vertical direction. In this case, the microlens with the projection of the edge on the outside can better achieve the light receiving effect for the pixel unit 1 due to a larger area, and improve the optical performance of the pixel structure.

Each of the pixel units 1 includes a color filter 11, a pixel microlens 12, and a photoelectric conversion layer 13 arranged successively from top to bottom. The color filter 11 can be a Color Filter Array (CFA), which is an optical filter for expressing colors, and can accurately select light waves that are in a small range and that expect to pass through, while reflecting other bands that do not expect to pass through. Each pixel unit 1 is corresponding to a pixel microlens 12, which can help the pixel unit 1 to better receive light, enable the pixel unit 1 to achieve better optical performance and improve image quality. The pixel microlens 12 in the single pixel unit 1 is surrounded by the first optical partition wall 2, which can better assist the pixel unit 1 in concentrating light. In addition, the shape, size, or material of the pixel microlens 12 can be selected automatically with practical application. The photoelectric conversion layer 13 can convert the light passing through the microlens and the color filter 11 into an electrical signal, and transmit the electrical signal to a processing unit through a circuit layer 7. The photoelectric conversion layer 13 may include elements such as a photodiode. Colors of the color filters 11 of the adjacent pixel units 1 are different, which can avoid the situation that when the colors of the color filters 11 of the adjacent pixel units 1 are the same, it is necessary to use pixel rearrangement technology to output high-resolution pictures, so as to make technical compromise, and can avoid image distortion and affecting the picture quality.

It should be noted that when the colors of the color filters 11 of the adjacent pixel units 1 are the same, the adjacent pixel synthesis technology is required. Because the adjacent pixel synthesis technology is carried out when the colors of the color filters 11 of the adjacent pixel units 1 are the same, and the color filters 11 are fixed and cannot be adjusted in position and shape, the pixel rearrangement technology must be used when outputting high-resolution pictures, that is, signal reconstruction is carried out at a circuit end or a software end. When the pixel rearrangement technology is used to output high-resolution pictures, many technical compromises may be made because of the fixed structure of the color filters 11. A lot of rearranged pixel information is "guessed", which leads to serious distortion of high-resolution pictures and affects the quality of output images.

In the embodiments of this application, colors of the color filters 11 of the adjacent pixel units 1 are different, so that technical compromise that is made by using the pixel rearrangement technology can be avoided, image distortion can be prevented, and the high-resolution picture that is output is a real pixel signal. In addition, the first optical partition wall 2 is arranged between the adjacent pixel units 1, so that crosstalk noise between pixels can be reduced, and the pixel microlens 12 is arranged under the color filter 11, which can help the pixel unit 1 to better concentrate light, and improve the optical performance. Therefore, in this application, better image quality can be obtained when the high-resolution image is output.

Furthermore, in this application, the pixel microlens 12 is arranged under the color filter 11, which can simplify calibration between the microlens and the pixel structure. The calibration includes calibration of a distance between the microlens and the pixel structure, calibration of a central axis, calibration of whether edges are right, and the like. Moreover, the pixel microlens 12 arranged under the color filter 11 in this application can replace lenses of a lens module on some cameras, which reduces a quantity of layers of lenses on the lens module or simplifies a structure of the lens module.

For example, at least four pixel units 1 are arranged to form a sub-pixel structure, for example, there are 4 pixel units 1, the 4 pixel units 1 are arranged in a matrix, and the 4 pixel units 1 are continuously arranged to form the sub-pixel structure. The pixel structure includes a plurality of sub-pixel structures, that is, the plurality of sub-pixel structures are continuously arranged to form an entire pixel structure. The microlens assembly includes a first lens unit, and the first lens unit is formed by arranging a plurality of first microlenses 3 in a same plane, where the first microlenses 3 are arranged opposite to the sub-pixel structures in a one-to-one correspondence, so that the pixel units 1 opposite to the first microlenses 3 are provided with at least two of the color filters 11 of a same color, that is, one of the first microlenses 3 is opposite to one of the sub-pixel structures, and at least 4 pixel units 1 forming the sub-pixel structure are provided with at least two of the color filters 11 of the same color. The above structure enables the pixel structure to assist in completing a Phase Detection Auto Focus (PDAF) function, enriches functions that can be realized by the pixel structure on the premise of improving the image quality, and is convenient for consumers to use.

Figure 2:
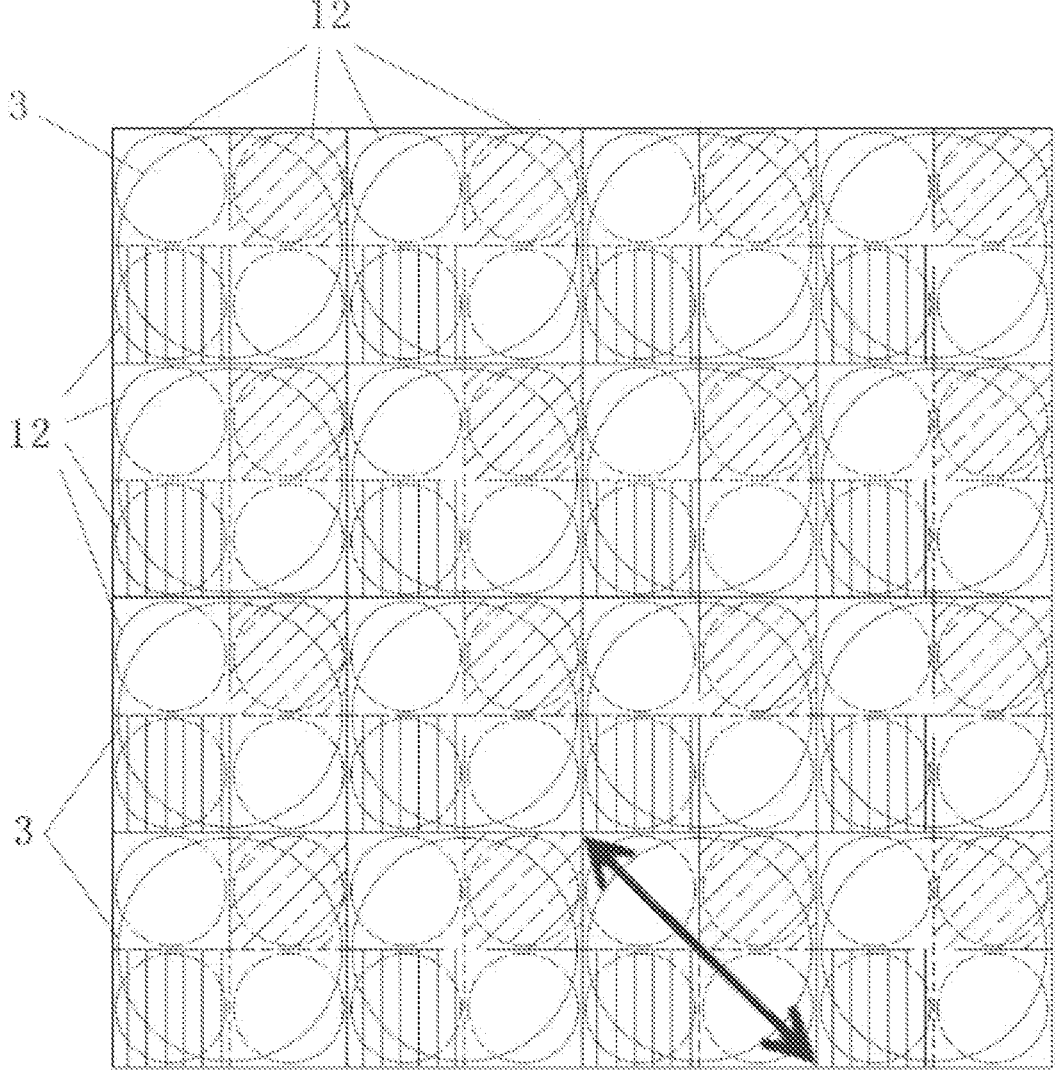
FIG. 2 is a top view of a first microlens opposite to 4 pixel units according to some embodiments of the present disclosure.

For example, as shown in FIG. 2, the sub-pixel structure includes 4 pixel units 1, and the 4 pixel units 1 are arranged in a 2×2 matrix form, where a pair of diagonally arranged pixel units 1 are provided with the color filters 11 of the same color. In this case, in the 4 pixel units 1 under the first microlens 3, there are two color filters 11 of the same color, which can realize a one-way PDAF function, and for example, realize a PDAF function with a 45-degree angle, a direction of which is shown as a two-way arrow in FIG. 2.

Figure 3:
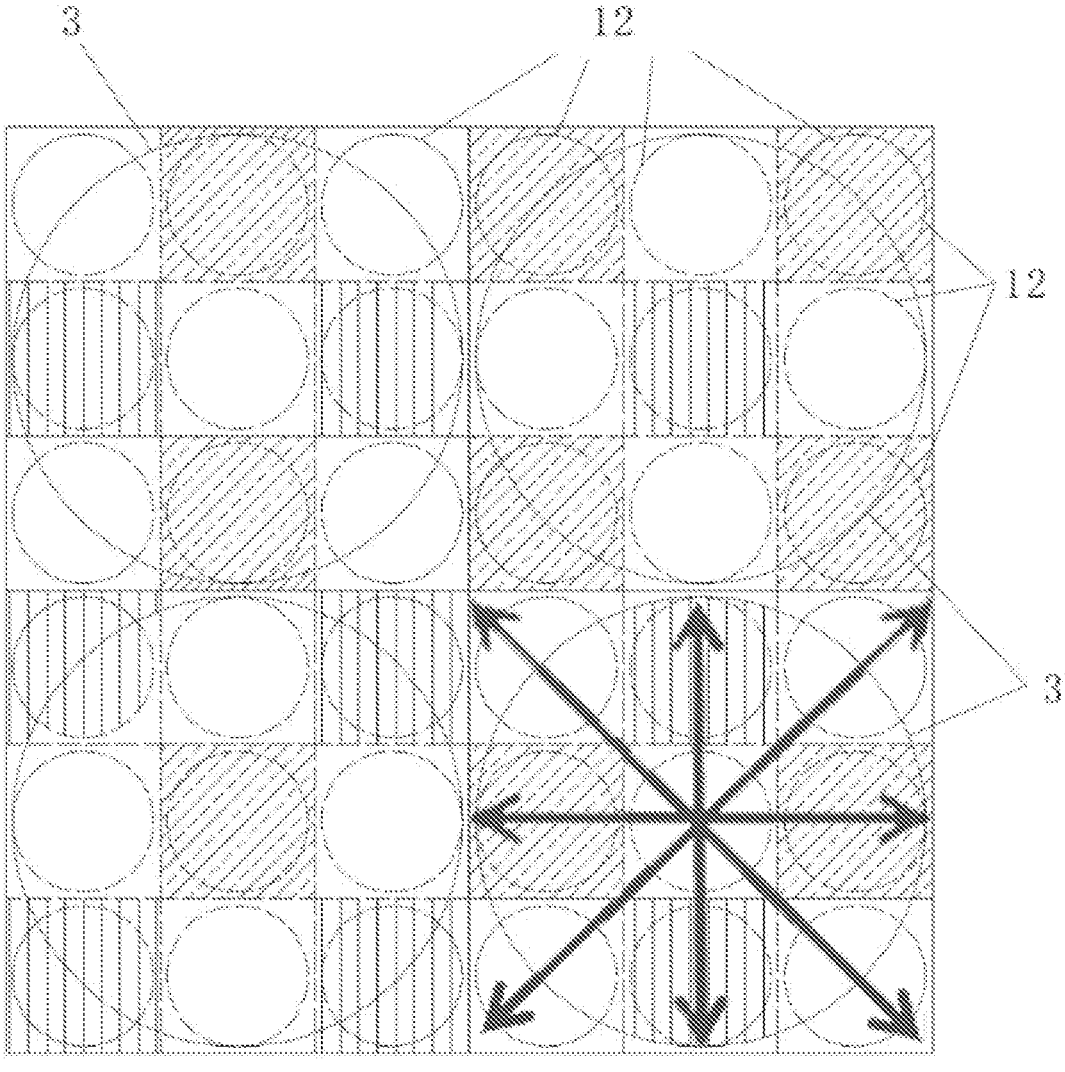
FIG. 3 is a top view of a first microlens opposite to 9 pixel units according to some embodiments of the present disclosure.

For example, as shown in FIG. 3, the sub-pixel structure includes 9 pixel units 1, the 9 pixel units 1 are arranged in a 3×3 matrix form, and among the pixel units 1 distributed on an edge of the matrix, the pixel units 1 arranged opposite to each other are provided with the color filters 11 of the same color. In this case, in the 9 pixel units 1 under the first microlens 3, there are four pairs of color filters 11 of the same color, each pair of color filters 11 can realize a one-way PDAF function, and for example, realize an omnidirectional PDAF function, a direction of which is shown as a two-way arrow in FIG. 3.

Figure 4:
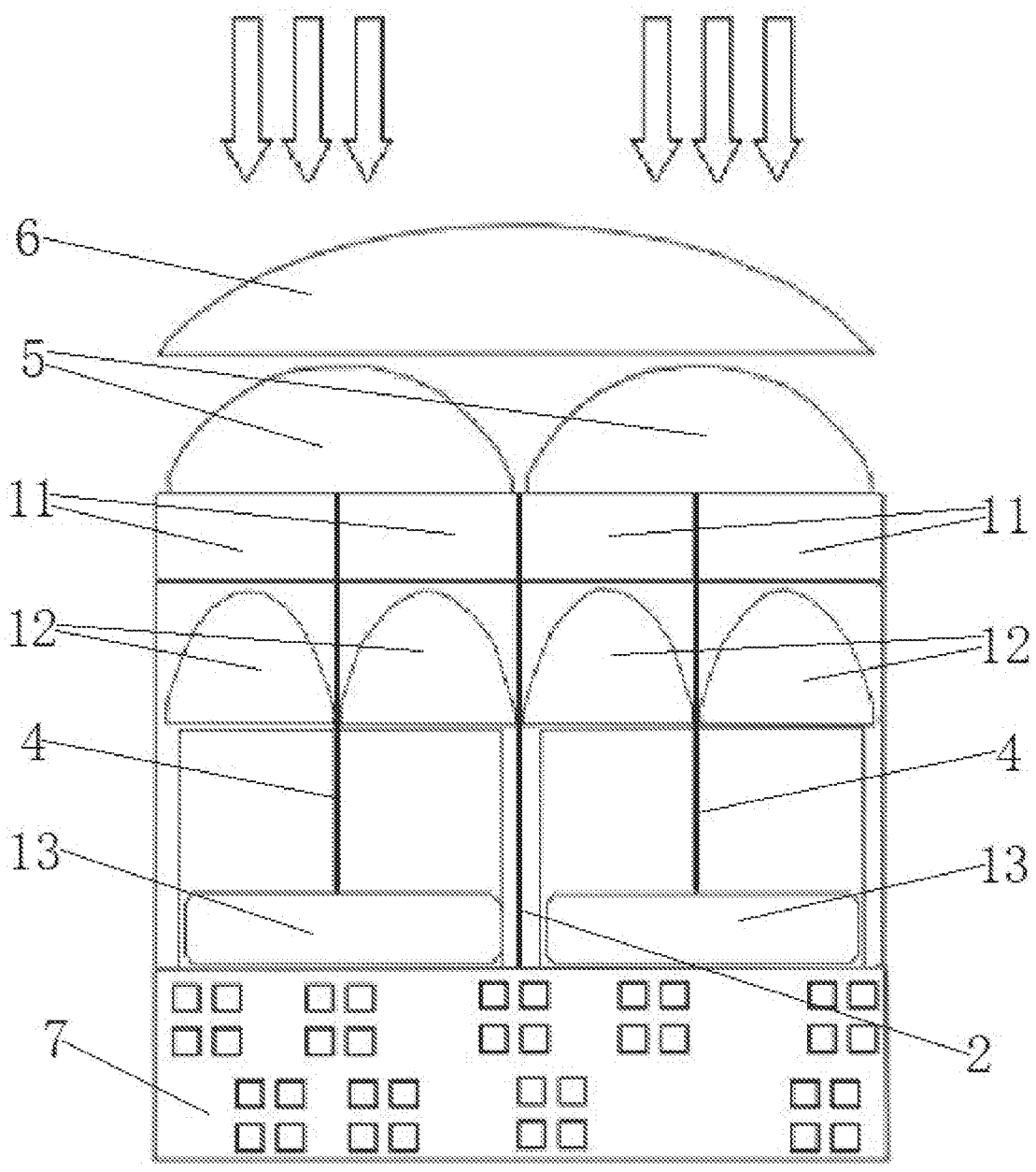
FIG. 4 is a schematic diagram of a structure of a pixel unit according to a second embodiment of the present disclosure.

For example, as shown in FIG. 4, a second optical partition wall 4 is arranged in the pixel unit 1, the second optical partition wall 4 extends from the color filter 11 to the photoelectric conversion layer 13, and the second optical partition wall 4 is perpendicular to the photoelectric conversion layer 13. The second optical partition wall 4 may or may not extend into the photoelectric conversion layer 13. The second optical partition wall 4 divides the pixel unit 1 into at least a first subunit and a second subunit, the first subunit and the second subunit are respectively provided with the color filter 11 and the pixel microlens 12 from top to bottom, and the first subunit and the second subunit share the photoelectric conversion layer 13. In other words, the same pixel unit 1 is divided into a first subunit and a second subunit by the second optical partition wall 4, and each of different pixel units 1 is provided with an independent photoelectric conversion layer 13, while the first subunit and the second subunit divided by the same pixel unit 1 share one photoelectric conversion layer 13. The above structure enables the same pixel unit 1 to be provided with a same quantity of pixel microlenses 12 as the divided subunits, which can increase the light concentrating effect of the pixel unit 1, improve the optical performance of the pixel structure, and improve the picture quality.

For example, the second optical partition wall 4 is embedded in the photoelectric conversion layer 13, which can prevent crosstalk noise between adjacent subunits divided by the same pixel unit 1. In addition, one first microlens 3 can realize the PDAF function by being opposite to only one pixel unit 1, because in this case, it is equivalent to being provided with at least two of the color filters 11 of the same color under a first microlens 3, which is qualified to realize the PDAF function.

For example, the microlens assembly includes at least a second lens unit and a third lens unit which are successively arranged from top to bottom, and the second lens unit and the third lens unit can cooperate with each other, for example, changing a distance between the second lens unit and the third lens unit, so that the lens unit can assist the pixel structure in achieving different functions, such as achieving better light receiving effect, achieving a larger light receiving angle, or achieving better light receiving efficiency. The microlens assembly may also include a fourth lens unit and a fifth lens unit on the basis of the second lens unit and the third lens unit.

For example, the second lens unit is formed by arranging a plurality of second microlenses 5 in a same plane, the third lens unit is formed by arranging a plurality of third microlenses 6 in a same plane, and the second microlens 5 and the third microlens 6 differ in shape and size, differ in shape, or differ in size. For example, sizes of four second microlenses 5 are the same as a size of one third microlens 6, and in this case, the shape of the microlens can be protruding hemisphere or depression, or the like. By changing a quantity of layers of stacked microlens arrays and the size and shape of each microlens, the complexity of the lens module placed at the front end of the pixel structure can be greatly reduced, and it can even replace the lens module to achieve lensless imaging. In addition, by adjusting a distance between different microlens arrays and filling materials, operational image applications such as light field cameras can be realized.

For example, manufacturing materials of the second lens unit and the third lens unit are nano materials, which can enhance the light receiving efficiency of the lens unit.

An image sensor, including the pixel structure as described above.

In the description of this specification, the description with reference to terms such as "an embodiment". "some embodiments", "a schematic embodiment", "an example", "a specific example", or "some examples" means that specific features, structures, materials, or characteristics described in combination with the embodiments or examples are included in at least one embodiment or example of the present disclosure. In this specification, the schematic descriptions of the above terms do not necessarily refer to the same embodiment or example. Moreover, the specific features, structures, materials, or characteristics described may be combined in a proper way in any one or more embodiments or examples.

Although the embodiments of the present disclosure have been shown and described, those of ordinary skill in the art can understand that various changes, modifications, replacements, and variants may be made to these embodiments without departing from the principle and purpose of the present disclosure, and the scope of the present disclosure is limited by the claims and their equivalents.

The invention claimed is:

1. A pixel structure, comprising:
   a plurality of pixel units adjacent to each other and arranged in an array;
   a first optical partition wall arranged between adjacent pixel units; and
   a microlens assembly located on an upper side of all the pixel units and opposite to all the pixel units, wherein
   each of the pixel units comprises a color filter, a pixel microlens, and a photoelectric conversion layer arranged successively from top to bottom,
   the first optical partition wall arranged between the adjacent pixel units extends from an upper surface of the color filter to a lower surface of the photoelectric conversion layer, and
   colors of color filters of the adjacent pixel units are different.

2. The pixel structure according to claim 1,
   wherein:
   at least four of the pixel units are arranged to form a sub-pixel structure,
   the pixel structure comprises a plurality of sub-pixel structures,
   the microlens assembly comprises a first lens unit, and
   the first lens unit is formed by arranging a plurality of first microlenses in a same plane,
   wherein the first microlenses are arranged opposite to the sub-pixel structures in a one-to-one correspondence, so that the pixel units opposite to the first microlens are provided with at least two of the color filters of a same color.

3. The pixel structure according to claim 2, wherein the sub-pixel structure comprises 4 pixel units, and the 4 pixel units are arranged in a 2×2 matrix form, wherein a pair of diagonally arranged pixel units are provided with the color filters 11 of the same color.

4. The pixel structure according to claim 2, wherein the sub-pixel structure comprises 9 pixel units, the 9 pixel units are arranged in a 3×3 matrix form, and among the pixel units distributed on an edge of the matrix, the pixel units arranged opposite to each other are provided with the color filters of the same color.

5. A pixel structure, comprising:
   a plurality of pixel units adjacent to each other and arranged in an array;
   a first optical partition wall arranged between adjacent pixel units; and
   a microlens assembly located on an upper side of all the pixel units and opposite to all the pixel units,
   wherein each of the pixel units comprises a color filter, a pixel microlens, and a photoelectric conversion layer arranged successively from top to bottom, and colors of color filters of the adjacent pixel units are different,
   wherein:
      a second optical partition wall is arranged in the pixel unit, the second optical partition wall extends from the color filter to the photoelectric conversion layer, and the second optical partition wall is perpendicular to the photoelectric conversion layer; and
      the second optical partition wall divides the pixel unit into at least a first subunit and a second subunit, wherein the first subunit and the second subunit are respectively provided with the color filter and the pixel microlens from top to bottom, and the first subunit and the second subunit share the photoelectric conversion layer.

6. The pixel structure according to claim 5, wherein the second optical partition wall is embedded in the photoelectric conversion layer.

7. The pixel structure according to claim 1, wherein the microlens assembly comprises at least a second lens unit and a third lens unit arranged successively from top to bottom.

8. The pixel structure according to claim 7, wherein the second lens unit is formed by arranging a plurality of second microlenses in a same plane, the third lens unit is formed by arranging a plurality of third microlenses in a same plane, and the second microlens and the third microlens differ in shape and size, differ in shape, or differ in size.

9. The pixel structure according to claim 7, wherein manufacturing materials of the second lens unit and the third lens unit are nano materials.

10. An image sensor, comprising:
    a pixel structure, comprising:
       a plurality of pixel units adjacent to each other and arranged in an array;
       a first optical partition wall arranged between adjacent pixel units; and
       a microlens assembly located on an upper side of all the pixel units and opposite to all the pixel units, wherein each of the pixel units comprises a color filter, a pixel microlens, and a photoelectric conversion layer arranged successively from top to bottom, the first optical partition wall arranged between the adjacent pixel units extends from an upper surface of the color filter to a lower surface of the photoelectric conversion layer, and
colors of color filters of the adjacent pixel units are different.

11. The image sensor according to claim 10, wherein:
    at least four of the pixel units are arranged to form a sub-pixel structure,
    the pixel structure comprises a plurality of sub-pixel structures,
    the microlens assembly comprises a first lens unit, and
    the first lens unit is formed by arranging a plurality of first microlenses in a same plane,
    wherein the first microlenses are arranged opposite to the sub-pixel structures in a one-to-one correspondence, so that the pixel units opposite to the first microlens are provided with at least two of the color filters of a same color.

12. The image sensor according to claim 11, wherein the sub-pixel structure comprises 4 pixel units, and the 4 pixel units are arranged in a 2×2 matrix form, wherein a pair of diagonally arranged pixel units are provided with the color filters 11 of the same color.

13. The image sensor according to claim 11, wherein the sub-pixel structure comprises 9 pixel units, the 9 pixel units are arranged in a 3×3 matrix form, and among the pixel units distributed on an edge of the matrix, the pixel units arranged opposite to each other are provided with the color filters of the same color.

14. The image sensor according to claim 10, wherein:
    a second optical partition wall is arranged in the pixel unit, the second optical partition wall extends from the color filter to the photoelectric conversion layer, and the second optical partition wall is perpendicular to the photoelectric conversion layer; and
    the second optical partition wall divides the pixel unit into at least a first subunit and a second subunit, wherein the first subunit and the second subunit are respectively provided with the color filter and the pixel microlens from top to bottom, and the first subunit and the second subunit share the photoelectric conversion layer.

15. The image sensor according to claim 14, wherein the second optical partition wall is embedded in the photoelectric conversion layer.

16. The image sensor according to claim 10, wherein the microlens assembly comprises at least a second lens unit and a third lens unit arranged successively from top to bottom.

17. The image sensor according to claim 16, wherein the second lens unit is formed by arranging a plurality of second microlenses in a same plane, the third lens unit is formed by arranging a plurality of third microlenses in a same plane, and the second microlens and the third microlens differ in shape and size, differ in shape, or differ in size.

18. The image sensor according to claim 16, wherein manufacturing materials of the second lens unit and the third lens unit are nano materials.

19. The pixel structure according to claim 5, wherein:
    at least four of the pixel units are arranged to form a sub-pixel structure,
    the pixel structure comprises a plurality of sub-pixel structures,
    the microlens assembly comprises a first lens unit, and the first lens unit is formed by arranging a plurality of first microlenses in a same plane, wherein the first microlenses are arranged opposite to the sub-pixel structures in a one-to-one correspondence, so that the pixel units opposite to the first microlens are provided with at least two of the color filters of a same color.

\* \* \* \* \*